Feb. 26, 1952 W. H. MYERS 2,586,854

PRINTED CIRCUIT CONSTRUCTION

Filed April 19, 1947 2 SHEETS—SHEET 1

INVENTOR
WILLIAM H. MYERS
BY
ATTORNEY

Feb. 26, 1952 W. H. MYERS 2,586,854

PRINTED CIRCUIT CONSTRUCTION

Filed April 19, 1947 2 SHEETS—SHEET 2

INVENTOR
WILLIAM H. MYERS
BY
ATTORNEY

Patented Feb. 26, 1952

2,586,854

UNITED STATES PATENT OFFICE 2,586,854

PRINTED CIRCUIT CONSTRUCTION

William H. Myers, Fort Wayne, Ind., assignor, by mesne assignments, to Farnsworth Research Corporation, a corporation of Indiana Application April 19, 1947, Serial No. 742,655

4 Claims. (Cl. 250—16)

This invention relates to printed electric circuits and particularly relates to a novel laminated plate having disposed thereon conductors and circuit components and arranged to provide electrostatic and electromagnetic shielding between groups of the circuit components.

The input circuit of an electron discharge device, such as an amplifier, usually must be shielded electrostatically and electromagnetically from the output circuit of the amplifier. This is effected in a conventional radio receiver by spacially separating the circuit components forming the input circuit from those forming the output circuit.

Recently so-called printed circuits have been proposed for special applications where space is at a premium such, for example, as for hearing aids. A printed circuit conventionally comprises a dielectric plate having printed on or bonded to both its surfaces electric conductors in the form of conducting paths and circuit components such as resistors and condensers. It has, for example, been suggested to arrange a circuit for coupling two amplifier stages on the two surfaces of a dielectric plate. These printed circuits have been used heretofore with special miniature tubes.

However, in view of the fact that the circuit components provided on the two surfaces of a dielectric plate are not electrostatically and electromagnetically shielded from each other, it has not been possible heretofore to arrange the entire input and output circuit of an electron discharge device such as an amplifier on one such plate. Printed circuits of this type greatly reduce the number of soldered connections required in any given circuit because the circuit components provided on the plate may be connected by conductors in the form of conducting paths which are directly printed on or bonded to the surface of the plate. It would, accordingly, be desirable to arrange these printed circuits in such a manner that standard vacuum tubes may be mounted thereon and that connections may be made selectively from the prong of a tube socket to the circuit components on either one of the two surfaces of the plate. In that case it would be possible to utilize printed circuits in the construction of conventional radio receivers with a large saving in labor due to the reduced number of soldered connections which normally must be provided between the circuit components.

It is an object of the present invention, therefore, to provide a novel laminated plate bearing printed conductors and circuit elements and having means for electrostatically and electromagnetically shielding the circuit components on one of the surfaces of the laminated plate from those on the reverse surface of the plate.

Another object of the invention is to provide a laminated plate for a printed circuit having apertures extending therethrough and contact elements in the apertures for connecting circuit components on one of the surfaces of the plate either to circuit components on the opposite surface of the plate or to an electrostatic shield provided in the center of the laminated plate.

A further object of the invention is to provide a laminated plate for a printed circuit having apertures therein for mounting the prongs of standard vacuum tubes or of transformers and the like circuit components which cannot be printed or otherwise provided on the surfaces of the laminated plate.

In accordance with the present invention there is provided a first and a second dielectric member and a conductive layer disposed between the two members. Circuit components are provided on the outer surfaces of the two members. The conductive layer which is preferably connected to ground accordingly forms an electrostatic shield between the circuit components on the outer surfaces of the two members. Preferably the circuit components disposed on the outer surface of one of the dielectric members form the input circuit of an electron discharge device, while the circuit components on the outer surface of the other dielectric member form the output circuit of the electron discharge device.

For a better understanding of the invention, together with other and further objects thereof, reference is made to the following description, taken in connection with the accompanying drawings, and its scope will be pointed out in the appended claims.

Figure 1:
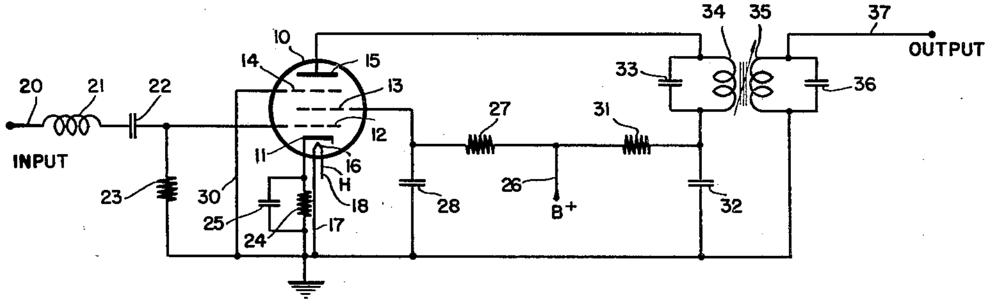
Fig. 1 is a circuit diagram of an amplifier.

Referring now to Fig. 1 of the drawings, there is illustrated, by way of example, a conventional amplifier circuit which may be printed or otherwise provided on a laminated plate in accordance with the present invention. The amplifier circuit of Fig. 1 may be used, for instance, as the intermediate-frequency amplifier stage of a superheterodyne radio receiver and includes pentode 10 which may be of the 6SK7 type. Pentode 10 comprises cathode 11, control grid 12, screen grid 13, suppressor grid 14 and anode or plate 15. Cathode 11 may be indirectly heated by filament 16 having one lead 17 connected to ground as shown, and another lead 18 connected to the heater supply as indicated at H.

The input signal is impressed upon input lead 20 connected to control grid 12 through peaking coil 21 and coupling condenser 22 arranged in series. Peaking coil 21 is provided for improving the high frequency response of the amplifier. Control grid 12 is connected to ground through grid leak resistor 23. Cathode 11 is connected to ground through a biasing network including cathode resistor 24 by-passed by condenser 25. Screen grid 13 is connected to a suitable anode voltage supply indicated at B+ through lead 26 and a suitable screen grid resistor 27 which is by-passed to ground by condenser 28. Suppressor grid 14 is connected to ground through lead 30.

Anode 15 is also connected to the anode voltage supply B+ through anode resistor 31 which is by-passed to ground by condenser 32. In the anode circuit there is provided a tuned circuit including fixed condenser 33 and inductance element 34 which may be tunable by permeability tuning as is conventional. Inductance element 34 forms the primary of a transformer, the secondary of which is formed by inductance element 35 which may also be permeability tuned and which is by-passed by a fixed condenser 36. The output signal is obtained from output lead 37, while the opposite terminal of inductance element 35 is grounded.

It is to be understood that the circuit of Fig. 1 has merely been shown by way of example, in order to describe more clearly the printed circuit which may be provided on the laminated plate in accordance with this invention.

Figure 2:
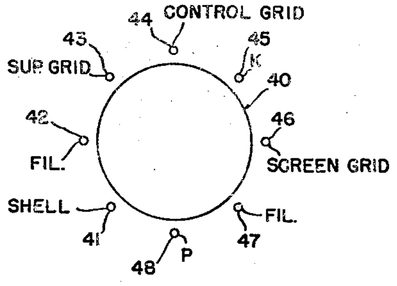
Fig. 2 is a plan view of a vacuum tube socket and its prongs.

Referring now to Fig. 2, there is illustrated a plan view of tube socket 40 of a 6SK7 type pentode such as shown at 10 in Fig. 1. The tube is provided with eight prongs 41, 42, 43, 44, 45, 46, 47 and 48. Prongs 41 to 48 connect respectively to the shell, one terminal of the filament, the suppressor grid, the control grid, the cathode, the screen grid, the other terminal of the filament and the plate of tube 10 as indicated.

Figure 3:
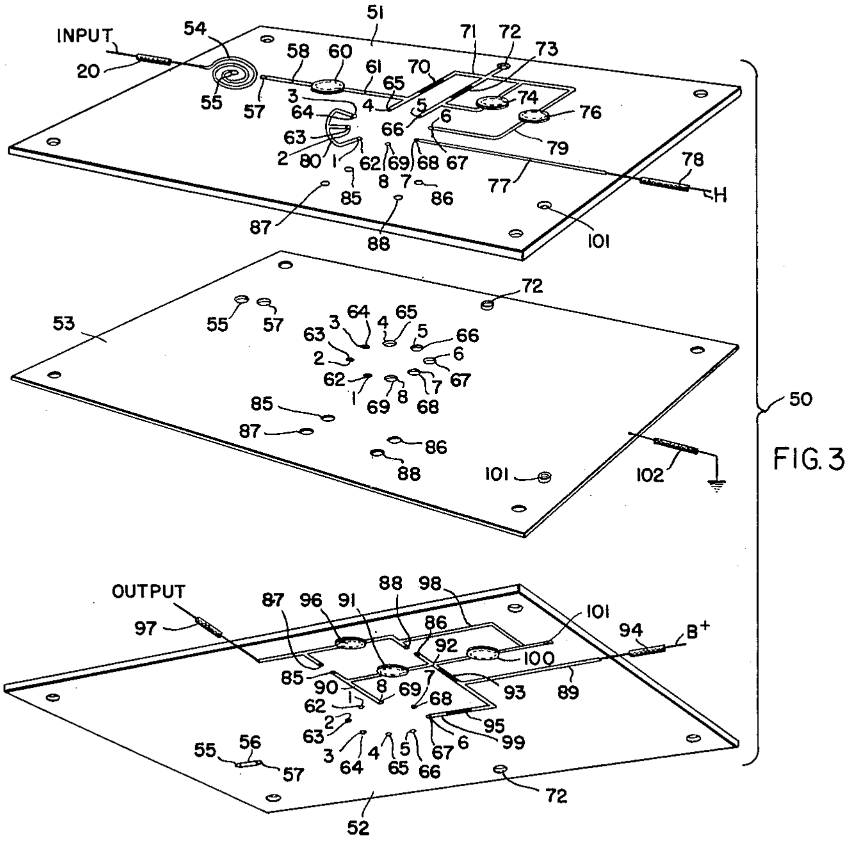
Fig. 3 is an exploded perspective view of a laminated plate embodying the present invention and bearing a printed circuit corresponding to the circuit of Fig. 1.

Referring now to Fig. 3, there is shown an exploded perspective view of laminated plate 50 including dielectric top plate 51, dielectric bottom plate 52 and metallic layer 53. Dielectric plates 51 and 52 may consist of any suitable dielectric material and preferably are made of a ceramic such as steatite. It is furthermore feasible to make plates 51, 52 of glass which may be molded to a desired shape. Metallic layer 53 may consist of a sheet of metal, but it is preferred to apply metallic layer 53 by spraying the metal on one of the adjacent surfaces of plates 51, 52. Although metallic layer 53 will ordinarily be bonded to at least one of the adjacent surfaces of sheets 51 and 52, it has been shown for convenience in Fig. 3 as being separated from both plates 51 and 52. Metallic layer 53 electrostatically shields the circuit components provided on the outer surface of plate 51 from those disposed on the outer surface of plate 52. If metallic layer 53 is of a suitable thickness which depends upon the frequency of the signal, it may also serve as an electromagnetic shield between the outer surfaces of plates 51 and 52. Preferably metallic layer 53 is connected to ground through wire 102 which may have one terminal soldered or otherwise connected to layer 53 and its other terminal grounded as shown.

Thus, in accordance with the present invention it is feasible to provide the input circuit of an electron discharge device such as amplifier 10 on the outer surface of dielectric plate 51, while the output circuit of amplifier 10 is arranged upon the outer surface of plate 52. In Fig. 3 the circuit components of the circuit illustrated by way of example in Fig. 1 have been shown applied to laminated plate 50.

The input signal is impressed upon input lead or wire 20 which is connected by soldering or in any other suitable way to printed coil 54 corresponding to peaking coil 21. As shown in Fig. 3, printed coil 54 may consist of a conducting path in the shape of a helix which may be applied to dielectric plate 51 by printing or spraying, for example, silver oxide through a suitable stencil or template onto the surface of plate 51. The silver oxide is then burned on plate 51 to provide a silver coating on the plate, in accordance with conventional methods. It is also feasible to utilize a silk screening process which is another conventional method.

At the center point of coil 54 there is provided aperture 55 which extends through plate 51, metallic layer 53 and plate 52 as indicated. On the outer surface of plate 52 there is provided a conductor 56 which extends from aperture 55 to aperture 57 which also passes through the three layers of laminated plate 50. In a manner to be described hereinafter a connection is made by transfer conductors through apertures 55 and 57 for connecting the center point of coil 54 with conductor or conducting path 58 provided on plate 51. Conductors 56 and 58 are bonded to the surface of plates 53 and 51 in the same manner as is coil 54.

Conductor 58 is connected with condenser 60 corresponding to coupling condenser 22 in Fig. 1. The other terminal of condenser 60 is connected to conductor 61. Condenser 60 may be provided in a conventional manner on plate 51 and may consist of a conducting layer bonded to plate 51 which is covered by a dielectric circular sheet which in turn is provided on its outer surface with another conductive layer.

Laminated plate 50 is provided with eight apertures indicated at 62, 63, 64, 65, 66, 67, 68 and 69 which have been labeled on the three sheets 51, 53 and 52 with consecutive numerals from 1 to 8. Apertures 62 to 69 are arranged to receive prongs 41 to 48 of tube socket 40 illustrated in Fig. 2.

Thus, conductor 61 extends to aperture 65 which will receive prongs 44 (Fig. 2) for connection to the control grid 12 of tube 10.

Resistor 70 is also connected to conductor 61 and corresponds to grid leak resistor 23. Resistor 70 may be bonded to the surface of dielectric plate 51 by applying thereto carbon mixed with a suitable binder as is conventional. The other terminal of resistor 70 is connected to conductor 71 which in turn leads to aperture 72 extending through laminated plate 50. By means of aperture 72 conductor 71 may be connected to ground by a transfer conductor in a manner to be explained hereinafter.

Conductor 71 leads to aperture 66 through resistor 73 corresponding to cathode resistor 24. Aperture 66 is adapted to receive prong 45 which is connected to cathode 11 of tube 10. Resistor 73 is by-passed by condenser 74 corresponding to by-pass condenser 25 so that resistor 73 and condenser 74 form a biasing network. Condenser 76 is connected between conductor 71 and conductor 79 leading to aperture 67 which is adapted to receive prong 46 connected to screen grid 13 of tube 10. Condenser 76 accordingly corresponds to condenser 28. Conductor 77 connects lead or wire 78 to the heater supply H and extends to aperture 68 which is arranged for receiving prong 47 connected to one terminal of the filament of the tube. Thus, conductor 77 and wire 78 correspond to lead 18 in Fig. 1.

Conductor 80 extends between apertures 62, 63 and 64 for a purpose to be explained hereinafter. Apertures 62, 63 and 64 are adapted to receive respectively prongs 41, 42 and 43 connecting to the shell, one terminal of the filament and the suppressor grid which are all grounded.

Figure 8:
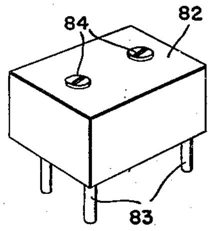
Fig. 8 is a view in perspective of a conventional tunable transformer and its pins.

The output circuit of tube 10 is provided on the outer surface of dielectric plate 52. The output circuit includes an intermediate-frequency transformer corresponding to inductance elements 34 and 35. The transformer may be arranged in a suitable housing 82 as illustrated in Fig. 8 which is provided with four pins 83. By means of screws 84 the position of each of the two cores with respect to its associated coil may be varied thereby to effect permeability tuning of the transformer.

For receiving the four pins 83 of transformer 82, there are provided four apertures 85, 86, 87 and 88 through laminated plate 50. Between apertures 85 and 69 there is provided conductor 90. Aperture 69 is arranged for receiving prong 48 which is connected to plate 15 of tube 10. Condenser 91 is arranged between conductors 90 and 92 which latter in turn leads to aperture 86. Condenser 91 corresponds to condenser 33. It is to be understood that an inductance element corresponding to coil 34 will be provided between apertures 85 and 86 when transformer housing 82 is inserted into apertures 85 to 88. Conductor 92 is connected through resistor 93 corresponding to anode resistor 31 with the anode voltage supply indicated at B+ through wire 94 and conductor 89. Resistor 95 is connected to wire 94 through conductor 89. The other terminal of resistor 95 is connected to conductor 99 extending to aperture 67 which will receive prong 46 connected to screen grid 13. Resistor 95 accordingly corresponds to screen grid resistor 27.

Between apertures 87 and 88 an inductance element corresponding to coil 35 will be connected which is by-passed by condenser 96 corresponding to condenser 36 in Fig. 1. Output lead or wire 97 is connected to condenser 96 through a conductor leading to aperture 87 and corresponds to output lead 37, while the other terminal of condenser 96 is connected to ground through conductor 98 extending to aperture 88 in a manner to be described hereinafter. Condenser 100 corresponds to condenser 32 and is connected between conductor 98, that is ground, and the junction point of condenser 91 and resistor 93. Conductor 98 leads to aperture 101 extending through laminated sheet 50.

Figure 5:
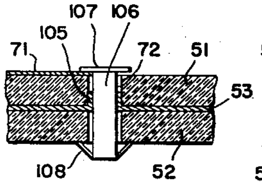
Fig. 5 is a cross sectional view taken on lines 5—5 of Fig. 4, and illustrates a connection between a conductor on the top surface of the laminated plate and the grounded electrostatic shield thereof.

It will be understood that various connections between the outer surfaces of plates 51, 52 and metallic layer 53 may be effected through the apertures extending through laminated plate 50. As illustrated, for example, in Fig. 5, aperture 72 may receive a transfer conductor arranged for connecting conductor 71 to metallic layer 53 thereby to ground conductor 71 through wire 102 connected to ground as shown in Fig. 3. To this end a metallic sleeve 105 may be extended from metallic layer 53 or may be electrically connected thereto. Contact element or transfer conductor 106 is arranged to be pushed through aperture 72, and its head portion 107 will make contact with conductor 71 while its shank contacts sleeve 105. Spring clip 108 retains transfer conductor 106 as illustrated.

Figure 6:
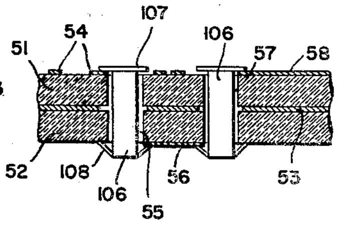
Fig. 6 is a cross sectional view taken on lines 6—6 of Fig. 4, and shows a connection from the center of a printed coil provided on the top surface of the laminated plate to the bottom surface of the plate and back to the output conductor of the coil.

Fig. 6 is a cross sectional view through coil 54 and apertures 55 and 57. Transfer conductors 106 are provided in apertures 55 and 57. Thus, head 107 of the contact element in aperture 55 makes contact with coil 54 on plate 51, and its spring clip 108 contacts conductor 56 on bottom plate 52. Transfer conductor 106 in aperture 57 connects conductor 56 on plate 52 to conductor 58 on plate 51 as illustrated. It will be observed that metallic layer 53 is spaced about transfer conductors 106 so that transfer conductors 106 cannot make electrical contact with metallic layer 53. As shown in Fig. 3, apertures 55 and 57 and metallic layer 53 are larger than those in plates 51 and 52. On the other hand, apertures 72 and 101 in metallic layer 53 are smaller than apertures 55 and 57.

By means of the transfer connection illustrated in Fig. 6 it is feasible to avoid crossovers between circuit elements or conductors. This is accomplished by simply connecting a circuit element or conductor to a conductor on the opposite plate and then making a return connection to the first plate at a suitable distance from the first connection.

Figure 7:
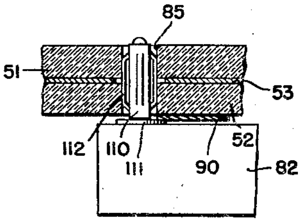
Fig. 7 is a cross sectional view taken on line 7—7 of Fig. 4, and illustrates a fragmentary portion of a transformer and a contact element for connecting one pin of the transformer to a conductor on the laminated plate.

In Fig. 7 there is shown a fragmentary portion of transformer housing 82 which has one of its pins 83 inserted into aperture 85 for making contact with conductor 90. To this end there is provided contact element 110 which consists of a hollow sleeve having a head portion 111 which contacts conductor 90. Contact sleeve 110 is slotted as shown at 112 to provide yielding projections for insuring electrical contact between contact sleeve 110 and the pin on transformer 82. It will be observed again that aperture 85 in metallic layer 53 is larger than those in plates 51 and 52 to prevent electrical contact between metallic layer 53 and contact sleeve 110.

It is to be understood that suitable contact sleeves such as illustrated at 110 in Fig. 7 may be provided in apertures 62 to 69 for inserting therein prongs 41 to 48 of the tube. The transfer conductors which may be provided in apertures 62 to 64 in plate 51 are interconnected by conductor 80 on plate 51 to insure proper connection to ground of prongs 41 to 43. However, if each prong 41 to 43 is separately connected to ground, conductor 80 is superfluous and may be omitted.

Figure 9:
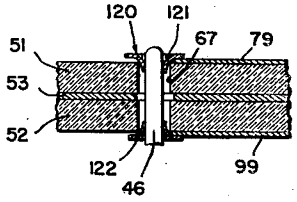
Fig. 9 is a cross sectional view taken on line 9—9 of Fig. 4, and shows contact elements for connecting the prong of a tube to conductors on the outer surfaces of the laminated plate.

As shown in Fig. 9, electrical contact may be established between a conductor on plate 51 or 52 and one of the prongs 41 to 48 of tube socket 40 by means of contact elements 120. Fig. 9 illustrates a sectional view through aperture 67 adapted to receive prong 46 which connects to the screen grid of the tube. Accordingly, prong 46 should be electrically connected to conductors 79 and 99 which are connected in turn to condenser 76 and resistor 95. Contact element 120 having a central aperture may be suitably secured to conductor 79 and dielectric plate 51 by soldering or cementing and has a spring clip 121 for providing electrical contact with prong 46 extending through aperture 67 and contact element 120. Another contact element 122 is electrically connected to conductor 99 and may be identical to element 120. Thus, by inserting prong 46 through aperture 67, electrical connection is established between conductors 79 and 99 and prong 46. It is to be understood that the other prongs of the tube may be connected to their respective conductors in a similar manner.

Figure 4:
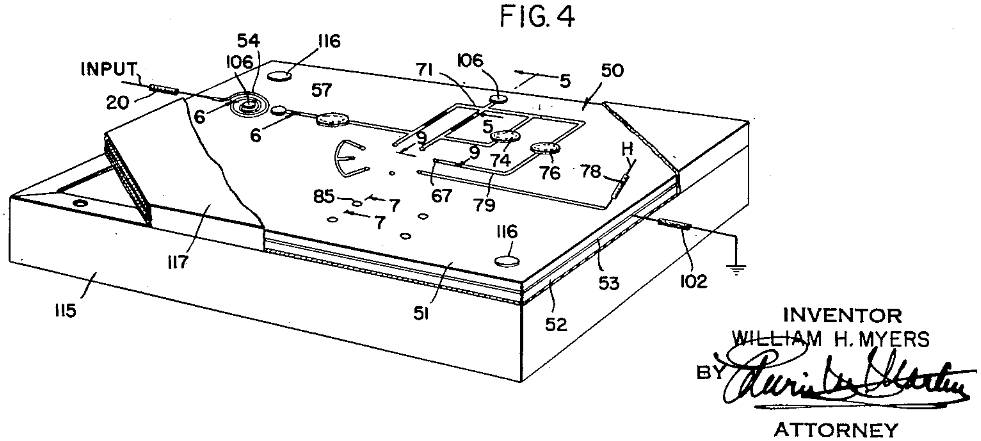
Fig. 4 is a view in perspective with parts broken away of the laminated plate of Fig. 3 mounted on a chassis.

Referring now to Fig. 4, there is illustrated laminated sheet 50 comprising dielectric plates 51, 52 and metallic layer 53 mounted on a suitable chassis frame 115. Laminated plate 50 may be secured to chassis frame 115 by suitable means such as screws 116. The height of chassis frame 115 may be such that tubes, transformers and the like component parts of the circuit may be arranged therein.

Preferably laminated plate 50 is provided with an insulating varnish shown at 117 which may be applied by spraying or by dipping laminated plate 50 into the varnish. Thus, all exposed conductors, resistors and condensers are covered by the insulating varnish. It is furthermore to be understood that several laminated plates such as shown at 50 may be superposed or stacked for providing thereon a plurality of printed circuits.

It will be seen that by means of the laminated plate 50 of the present invention even complicated circuits may be provided on one laminated plate with a resulting saving of a large number of soldered connections. Those circuit components such as tubes, transformers, ganged condensers and the like may be inserted into the laminated plates through suitable apertures which are preferably molded when the dielectric plates are manufactured. It is also feasible to mold dielectric plates 51 and 52 with up-turned edge portions in the shape of chassis frame 115 so that the entire laminated plate is self-supporting.

While there has been described what is at present considered the preferred embodiment of the invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. A first and a second dielectric member, a conductive layer extending substantially between the entire adjacent surfaces of said members, a first series of circuit components including conductors forming substantially an input circuit of an electron discharge device and disposed on the outer surface of said first member, and a second series of circuit components including conductors forming substantially an output circuit of the electron discharge device and disposed on the outer surface of said second member, said conductive layer providing an electrostatic shield between said input and output circuits of said electron discharge device.

2. A first and a second dielectric member, a metallic layer extending substantially between the entire adjacent surfaces of said members, a first series of circuit components including conductors forming substantially an input circuit of an electron discharge device and disposed on the outer surface of said first member, a second series of circuit components including conductors forming substantially an output circuit of the electron discharge device and disposed on the outer surface of said second member, a source of fixed potential, and means for connecting said source to said metallic layer, whereby said metallic layer electrostatically shields said input circuit from said output circuit.

3. A first and a second dielectric member, a metallic layer extending substantially between the entire adjacent surfaces of said members and forming an electrostatic shield, circuit components including conductors and impedance elements disposed on the outer surfaces of each of said members, means for holding said members and said layer together to form a unitary structure, terminals for the connection of electron discharge devices connected to said conductors, a layer of insulating material covering substantially said structure, said structure being provided with an aperture extending therethrough, and means insulated from said metallic layer disposed in said aperture for electrically connecting a conductor on said first member to a conductor on said second member.

4. A first and a second dielectric member, a metallic layer extending substantially between the entire adjacent surfaces of said members and forming an electrostatic shield, a source of fixed potential, means for connecting said source to said metallic layer, circuit components including conductors and impedance elements bonded to the outer surfaces of each of said members, terminals for the connection of electron discharge devices connected to said conductors, means for holding said members and said layer together to form a unitary structure, said structure being provided with an aperture extending therethrough, and means insulated from said metallic layer disposed in said aperture for electrically connecting a conductor on one of said members to said metallic layer.

WILLIAM H. MYERS.

REFERENCES CITED

The following references are of record in the file of this patent:

UNITED STATES PATENTS

| Number | Name | Date |
|---|---|---|
| 1,563,731 | Ducas | Dec. 1, 1925 |
| 1,939,130 | Mills | Dec. 12, 1933 |
| 1,960,058 | Lynn | May 22, 1934 |
| 2,066,511 | Arlt | Jan. 5, 1937 |
| 2,066,876 | Carpenter | Jan. 5, 1937 |
| 2,427,144 | Jansen | Sept. 9, 1947 |

FOREIGN PATENTS

| Number | Country | Date |
|---|---|---|
| 452,573 | Great Britain | Aug. 25, 1936 |

OTHER REFERENCES

Scientific American: August 1946, an article, Electronics, by John Markus; pages 63 to 65.

Electronic Industries: April 1946, an article on Printed Circuit Wiring, pages 90, 91 and 122.